United States Patent
Zanbaghi et al.

(10) Patent No.: US 9,503,112 B1
(45) Date of Patent: Nov. 22, 2016

(54) NON-LINEARITY CANCELLATION IN A DUAL-PATH ADC

(71) Applicant: Cirrus Logic International Semiconductor Ltd., Edinburgh (GB)

(72) Inventors: Ramin Zanbaghi, Austin, TX (US); Yousof Mortazavi, Austin, TX (US); Aaron Brennan, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/154,769

(22) Filed: May 13, 2016

(51) Int. Cl.
*H03M 1/06* (2006.01)
*H03M 1/10* (2006.01)

(52) U.S. Cl.
CPC ......... *H03M 1/0602* (2013.01); *H03M 1/1004* (2013.01); *H03M 1/1042* (2013.01)

(58) Field of Classification Search
CPC ........... H03M 1/0602; H03M 1/1004; H03M 1/1042; H03M 1/01; H01Q 3/267; H04L 27/368; H04B 7/0617
USPC .......................... 341/118–155; 375/296, 299
See application file for complete search history.

(56) References Cited

U.S. PATENT DOCUMENTS

| | | | |
|---|---|---|---|
| 2006/0133535 A1* | 6/2006 | Jung | H01Q 3/267 375/296 |
| 2009/0309772 A1* | 12/2009 | Fan | H03M 1/1004 341/120 |

\* cited by examiner

*Primary Examiner* — Lam T Mai
(74) *Attorney, Agent, or Firm* — Norton Rose Fulbright US LLP

(57) ABSTRACT

The overall performance of a dual-path ADC system may be improved by using a VCO-based ADC for small-amplitude signals and employing non-linear cancellation to remove nonlinearities in signals output by the VCO-based ADC. In particular, VCO-based dual-path ADC systems of this disclosure may be configured to receive a first digital signal from a first ADC and a second digital signal from a second ADC, wherein the second digital signal is more non-linear than the first digital signal. The dual-path systems may also be configured to determine one or more non-linear coefficients of the second digital signal based, at least in part, on processing of the first and second digital signals. The dual-path systems may be further configured to modify the second digital signal based, at least in part, on the determined one or more non-linear coefficients to generate a more linear second digital signal.

19 Claims, 7 Drawing Sheets

NON-LINEARITY CANCELLATION IN A DUAL-PATH ADC

FIELD OF THE DISCLOSURE

The instant disclosure relates to analog-to-digital converters (ADCs). More specifically, portions of this disclosure relate to non-linearity cancellation of an open-loop voltage-controlled oscillator (VCO) based ADC in a dual-path ADC.

BACKGROUND

Dual-path ADCs are used to apply different transfer functions to different types of signals. For example, FIG. 1 provides an example schematic block diagram illustrating a conventional dual-path ADC system according to the prior art. A conventional dual-path ADC system 100 has a first channel (path) 110 that includes a high dynamic range ADC 112, such as an ADC having a dynamic range of 100 dB, preceded by an anti-aliasing filter (AAF) 114 but no gain element. System 100 also includes a second channel 120 that includes a high dynamic range ADC 122 preceded by an AAF 124 having a programmable gain element. The first channel 110 and the second channel 120 receive input from an input node 130.

In dual-path ADC system 100, first channel 110 can be used to process signals with high amplitudes and second channel 120 can be used to process signals with low amplitudes. For example, if a strong signal is received at the input 130, then the output of channel 120 is a clipped version of the input signal while the output of channel 110 is a linear version of the input signal having a high dynamic range because the amplitude of the input signal is inherently high. In such a scenario, the output of channel 110 may be used as the digital representation of the input signal that gets post-processed. However, if a weak signal is received at the input 130, then the output of neither channel 110 or 120 is clipped, but the output of channel 120 will have a higher dynamic range because of the amplification applied by amplification block 124. In such a scenario, the output of channel 120 may be used as the digital representation of the input signal that gets post-processed.

Numerous drawbacks are associated with conventional dual-path ADC systems, such as system 100. For example, in order to achieve high dynamic range via the weak signal path 120, the amplifier 124 is required. However, the amplifier tends to cause more noise and require the overall system to consume more power and area.

Shortcomings mentioned here are only representative and are included simply to highlight that a need exists for improved electrical components, particularly for improved ADCs. Embodiments described herein address certain shortcomings but not necessarily each and every one described here or known in the art.

SUMMARY

The overall performance of a dual-path ADC system may be improved by using a VCO-based ADC for small-amplitude signals and employing non-linear cancellation to remove nonlinearities in signals output by the VCO-based ADC. An ADC system with two paths may be used to implement this processing technique. According to one embodiment, a dual-path ADC system may include a first analog to digital converter (ADC) configured to receive an input signal from an input terminal and generate a first digital signal; a second ADC configured to receive the input signal from the input terminal and generate a second digital signal, wherein the second digital signal is more non-linear than the first digital signal; and a digital signal processing block configured to: receive the first digital signal and the second digital signal; determine one or more non-linear coefficients of the second digital signal based, at least in part, on processing of the first and second digital signal; and/or modify the second digital signal based, at least in part, on the determined one or more non-linear coefficients to generate a more linear second digital signal. In some embodiments, the first ADC comprises a closed-loop ADC and the second ADC comprises an open-loop voltage controlled oscillator-based (VCO-based) ADC. According to another embodiment, the second ADC is configured to amplify the received input signal. In another embodiment, the first ADC is further configured to receive input signals having an amplitude higher than input signals for which the second ADC is configured to receive.

In certain embodiments, the digital signal processing block is configured to: generate one or more non-linear components of the second digital signal based, at least in part, on the determined one or more non-linear coefficients; and/or subtract the generated one or more non-linear components from the second digital signal. According to another embodiment, the digital signal processing block may also be configured to: filter the first and second digital signal; and/or select one of the filtered first digital signal and the filtered second digital signal for further processing. In some embodiments, to perform the selecting, the digital signal processing block may be configured to: select the filtered first digital signal when a signal strength associated with the input signal is equal to or exceeds a threshold signal strength; and/or select the filtered second digital signal when the signal strength associated with input signal is less than the threshold signal strength.

According to another embodiment, a method includes receiving a first digital signal from a first analog to digital converter (ADC); receiving a second digital signal from a second ADC, wherein the second digital signal is more non-linear than the first digital signal; determining one or more non-linear coefficients of the second digital signal based, at least in part, on processing of the first and second digital signal; and/or modifying the second digital signal based, at least in part, on the determined one or more non-linear coefficients to generate a more linear second digital signal.

In certain embodiments, the step of modifying comprises: generating one or more non-linear components of the second digital signal based, at least in part, on the determined one or more non-linear coefficients; and subtracting the generated one or more non-linear components from the second digital signal.

In some embodiments, the method further includes: filtering the first and second digital signal; and/or selecting one of the filtered first digital signal and the filtered second digital signal for further processing. According to an embodiment, the step of selecting comprises: selecting the filtered first digital signal when a signal strength associated with an input signal used to generate the first digital signal is equal to or exceeds a threshold signal strength; and/or selecting the filtered second digital signal when the signal strength associated with the input signal used to generate the second digital signal is less than the threshold signal strength.

According to another embodiment, a mobile device may include a controller integrated circuit (IC) configured to perform the steps comprising: receive a first digital signal from a first analog to digital converter (ADC); receive a second digital signal from a second ADC, wherein the second digital signal is more non-linear than the first digital signal; determine one or more non-linear coefficients of the second digital signal based, at least in part, on processing of the first and second digital signal; and/or modify the second digital signal based, at least in part, on the determined one or more non-linear coefficients to generate a more linear second digital signal. In some embodiments, the first ADC comprises a closed-loop ADC and the second ADC comprises an open-loop VCO-based ADC. In another embodiment, the controller comprises an audio coder/decoder (CODEC).

In certain embodiments, modifying comprises the controller being further configured to perform the steps comprising: generating one or more non-linear components of the second digital signal based, at least in part, on the determined one or more non-linear coefficients; and/or subtracting the generated one or more non-linear components from the second digital signal.

In some embodiments, the controller is further configured to perform the steps comprising: filtering the first and second digital signal; and/or selecting one of the filtered first digital signal and the filtered second digital signal for further processing. According to an embodiment, selecting, by the controller, comprises the controller being further configured to perform steps comprising: selecting the filtered first digital signal when a signal strength associated with an input signal used to generate the first digital signal is equal to or exceeds a threshold signal strength; and/or selecting the filtered second digital signal when the signal strength associated with the input signal used to generate the second digital signal is less than the threshold signal strength.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed systems and methods, reference is now made to the following descriptions taken in conjunction with the accompanying drawings. In the appended figures, similar components or features may have the same reference label. Further, various components of the same type may be distinguished by following the reference label with a second label that distinguishes among the similar components. If just the first reference label is used in the specification, the description is applicable to any one of the similar components having the same first reference label irrespective of the second reference label.

DETAILED DESCRIPTION

Figure 1:
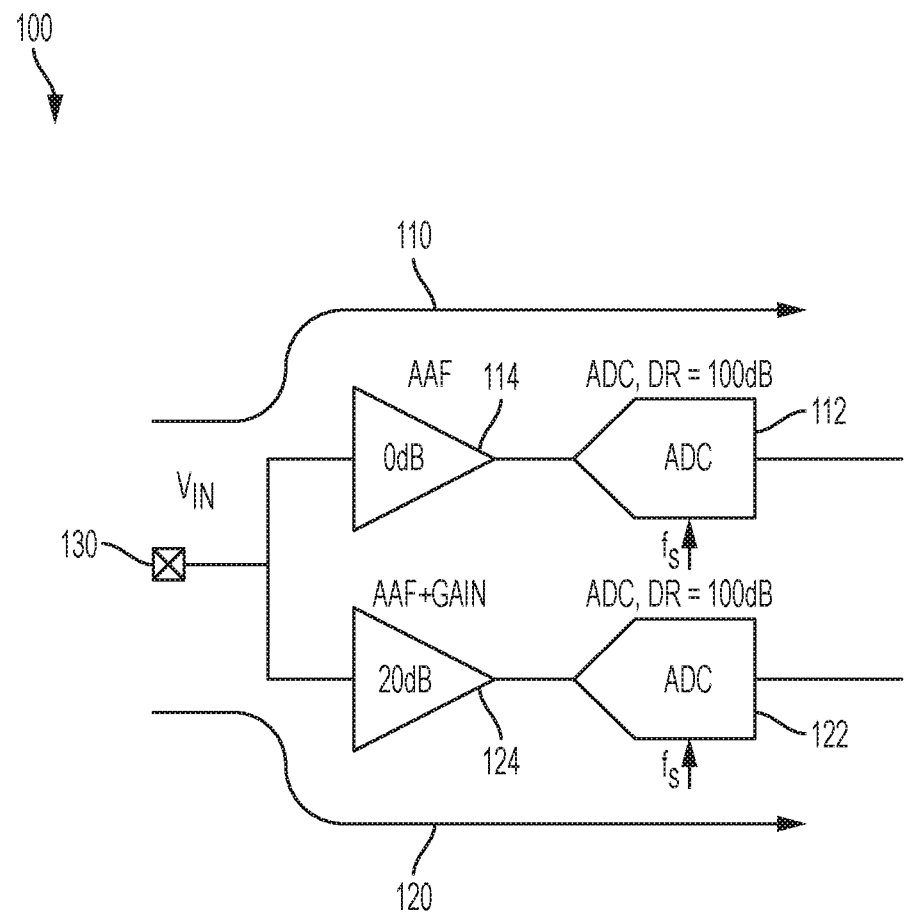
FIG. 1 is an example schematic block diagram illustrating a conventional dual-path ADC system according to the prior art.
Figure 2:
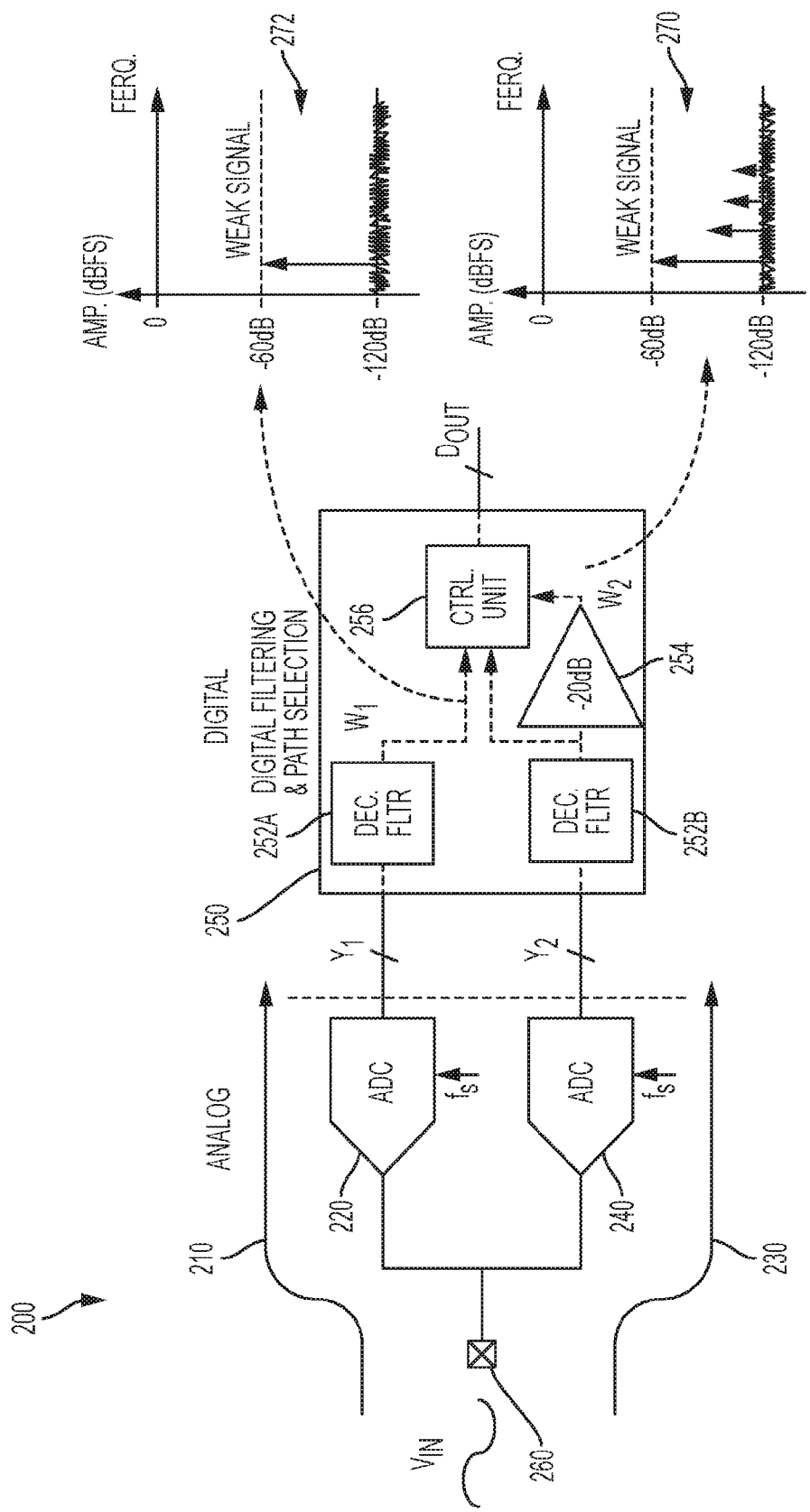
FIG. 2 is an example schematic block diagram illustrating a VCO-based dual-path ADC system with non-linear cancellation of a VCO-based ADC in the dual-path ADC system according to one embodiment of the disclosure.

FIG. 2 is an example schematic block diagram illustrating a VCO-based dual-path ADC system 200 with non-linear cancellation of a VCO-based ADC in the dual-path ADC system 200 according to one embodiment of the disclosure. In some embodiments, system 200 may be implemented as (or within) a controller integrated circuit (IC), such as an audio coder/decoder (CODEC). The VCO-based dual-path ADC system 200 includes a first ADC path 210. First ADC path 210 includes a first ADC 220 configured to receive an input signal from an input node 260 and also configured to generate a first digital signal Y1. In some embodiments, first ADC 220 may be a closed-loop ADC. According to one embodiment, first ADC 220 may be implemented as a closed-loop ADC using a switched-capacitor-based modulator. In another embodiment, first ADC 220 may be implemented as a closed-loop ADC using a continuous-time-based modulator. First ADC 220 may be configured to have a high dynamic range, such as a dynamic range of at least 100 dBFS (decibels relative to full scale). First ADC 220 may also be configured to handle strong input signals, such as signals having amplitudes of near 0 dBFS, or weak signals as small as 60 dBFS.

The VCO-based dual-path ADC system 200 also includes a second ADC path 230. Second ADC path 230 includes a second ADC 240 configured to receive the input signal from the input node 260 and generate a second digital signal. According to an embodiment, second ADC 240 may be an open-loop VCO-based ADC. In some embodiments, second ADC 240 may be configured to have a high dynamic range, such as a dynamic range of at least 100 dB. According to an embodiment, the high dynamic range of the VCO-based ADC 240 may be achieved with the internal gain of the VCO-based ADC 240. In other words, the high dynamic range of the VCO-based ADC 240 may be achieved without the use of pre-amplifiers, such as amplifier 124 used in channel 120 of prior art system 100, to increase the dynamic range of ADC channel 124 in prior art system 100.

Figure 3A:
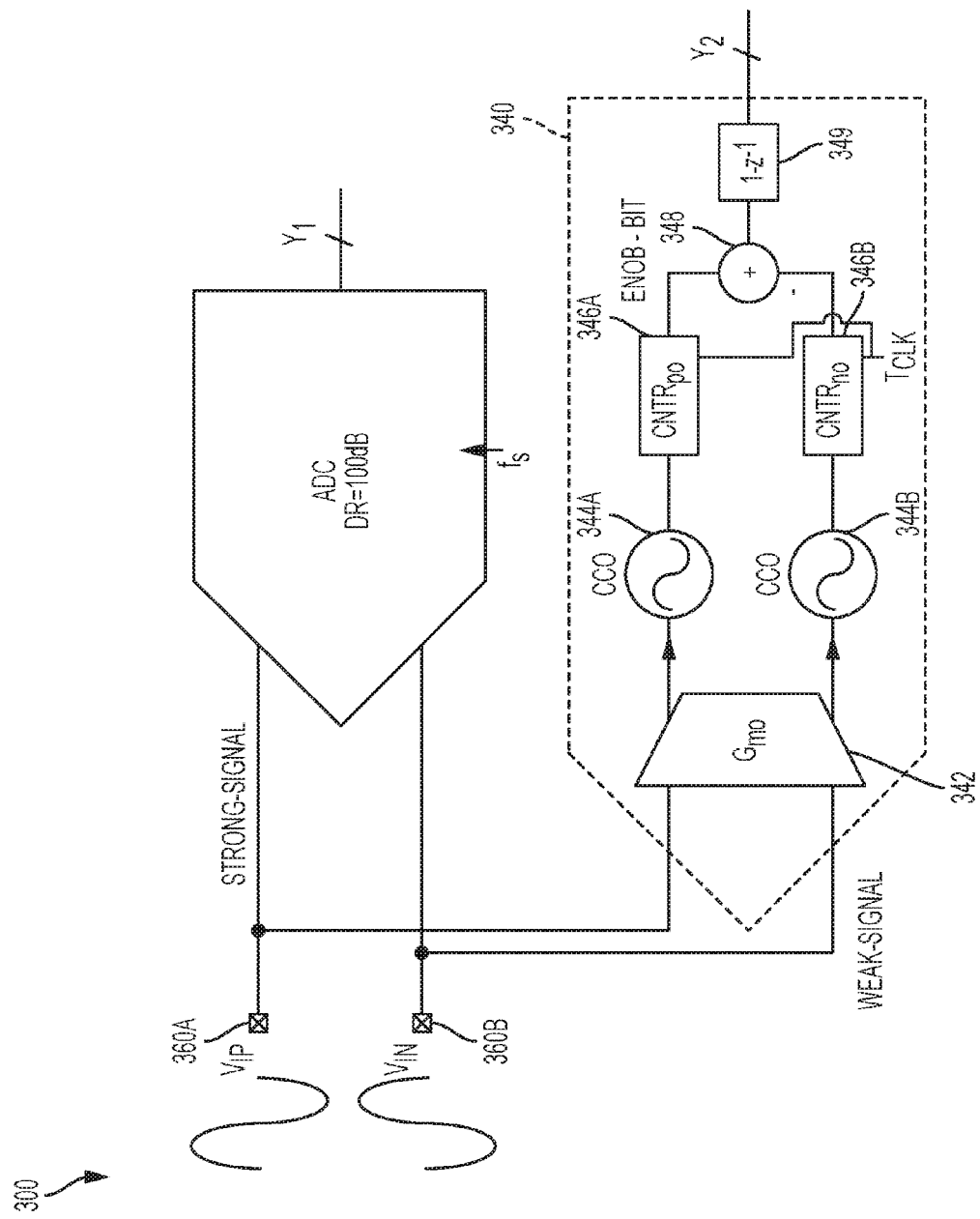
FIG. 3A is an example schematic block diagram illustrating details of a VCO-based ADC in a dual-path ADC system according to one embodiment of the disclosure.
Figure 3B:
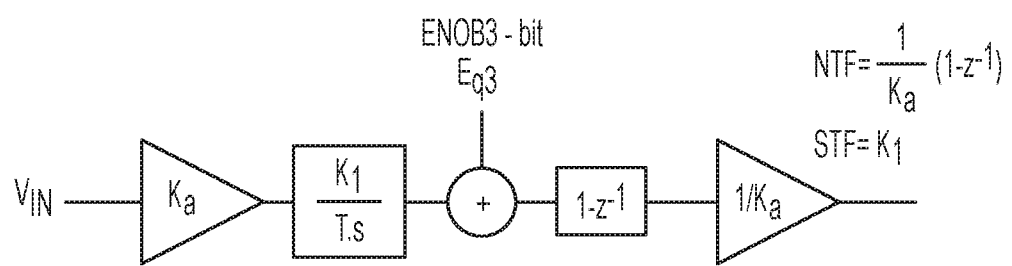
FIG. 3B is a linearized system-level diagram of the open-loop VCO-based ADC illustrated in FIG. 3A according to one embodiment of the disclosure.

FIG. 3A provides an example schematic block diagram illustrating details of a VCO-based ADC in a dual-path ADC system according to one embodiment of the disclosure; and FIG. 3B provides a linearized system-level diagram of the open-loop VCO-based ADC illustrated in FIG. 3A according to one embodiment of the disclosure. VCO-based ADC 340 may be one differential-input implementation of single-ended VCO-based ADC 240 illustrated in FIG. 2, in which high dynamic range may be achieved with the internal gain of the VCO-based ADC 340. As illustrated in FIG. 3A, VCO-based ADC 340 may include an internal transconductance block 342, current-controlled oscillators (CCOs) 344A and 344B, counters 346A and 346B, a subtractor block 348, and a differentiator block 349. Transconductance block 342 may convert the input voltage signals 360A and 360B to current signals. The current signals output by transconductance block 342 may be transferred to CCOs 344 to control the operation of CCOs 344 as a function of the current signals. Counters 346 (e.g., counters 346A and 346B) may be configured to operate at a sampling rate, such as $T_{clk}$, and sample the outputs of CCOs 344 to convert the analog signals received from CCOs 344 to digital signals. The digital signals output by counters 346 may be subtracted from each other at subtractor block 348 to obtain the digital representation for the input voltage signals 360. In some embodiments, counters 346 and subtractor block 348 may perform operations similar to a quantization block. Differentiator block 349 may be configured to receive the signal output from subtractor block 348 and output a differentiated digital signal representation for the input voltage signals 360. The output of differentiator block 349 may be post-processed as a digital representation of the input voltage signals 360.

Transconductance block 342 and CCOs 344 may be configured to provide amplification of input signals VIP and VIN receive at input nodes 360A-B. For example, in converting the input voltage signals 360 to currents, transconductance block 342 may be configured to provide a first amount of amplification. In addition, CCOs 344 may be configured to implement a second amount of amplification. For example, CCOs 344 may be configured to modify their operation in response to the current supplied by transconductance block 342 in such a manner that the output corresponds to an amplification of the input current signals provided by transconductance block 342.

In some embodiments, the amplification provided by transconductance block 342 and CCOs 344 may provide higher amplification than can be achieved with using pre-amplifiers preceding an ADC, such as pre-amplifier 124 used in channel 120 of prior art system 100 to increase the dynamic range of ADC channel 124 in prior art system 100. Accordingly, in response to a weak input signal, higher dynamic range may be achieved with VCO-based ADC 340 than can be achieved by prior art systems. In addition, in dual-path VCO-based ADCs of this disclosure, the VCO-based ADC of a dual-path ADC, such as second ADC 240 or ADC 340, may be configured to handle weak input signals while still providing high dynamic range outputs similar to the high dynamic range outputs provided by closed-loop ADCs implemented in dual-path ADCs of this disclosure, such as closed-loop ADC 220.

In addition to providing amplification, a dual-path ADC utilizing a VCO-based ADC, such as VCO-based ADC 240 or 340, may yield higher overall metrics than a conventional dual-path ADC with pre-amplifiers. For example, because internal features of VCO-based ADCs may be used to provide amplification, pre-amplifiers needed to process weak input signals are not needed for dual-path ADCs utilizing VCO-based ADCs. By removing the pre-amplifiers, dual-path VCO-based ADC systems of this disclosure may remove the extra noise contributions from the pre-amplifiers, such as the resistors used in the pre-amplifiers. Accordingly, in a dual-path VCO-based ADC system, such as systems 200 or 300, the majority of the thermal noise budget for the system may be allocated to transconductance block 340. In addition, by removing the pre-amplifiers, and other circuitry needed to operate with the pre-amplifiers, dual-path VCO-based ADC systems of this disclosure may be configured to have less area and consume less power, this in addition to having less noise contributors early in the signal path.

In some embodiments, the digital signal output by VCO-based ADC 340 may be more non-linear than the digital signal output by ADC 220 because a VCO-based ADC is inherently more non-linear due to its open-loop design. By contrast, closed-loop ADCs, such as ADC 220, may have their non-linearity improved by the closed-loop mechanisms of the system. Accordingly, in some embodiments, the second digital signal output by the second ADC path that includes VCO-based ADC 240 may be more non-linear than the first digital signal output by the first ADC path that includes closed-loop ADC 220.

Returning to FIG. 2, VCO-based dual-path ADC system 200 also includes a digital signal processing block 250. Digital signal processing block 250 may be configured to process signals received from the dual paths. In some embodiments, the digital signal processing block 250 may employ digital calibration techniques to reduce the amount of non-linearity present in signals propagating through second ADC path 230 that includes VCO-based ADC 240. Digital signal processing block 250 may also be configured to filter signals received via first ADC path 210 and/or second ADC path 230. According to an embodiment, digital signal processing block 250 may also be configured to select one of either the first digital signal output by the first ADC path 210 or the second digital signal output by the second ADC path 230 for additional processing.

Digital signal processing block 250 may include decimation filters 252A and 252B, attenuator 254, and control unit 256. Decimation filters 252A and 252B may be configured to filter the signals received from first ADC path 210 and/or second ADC path 230. For example, decimation filter 252A may be used to filter the first digital signal output by ADC path 210 and decimation filter 252B may be used to filter the second digital signal output by ADC path 230. Attenuator 254 may be used to attenuate the filtered second digital signal output by ADC path 230.

Control unit 256 may be configured to select one of the filtered first digital signal and the filtered second digital signal for further processing. For example, control unit 256 may be configured to select the filtered first digital signal output by ADC path 210 when a signal strength associated with the input signal $V_{IN}$ from input node 260 is equal to or exceeds a threshold signal strength. By contrast, control unit 256 may be configured to select the filtered second digital signal output by ADC path 230 when the signal strength associated with the input signal $V_{IN}$ is less than the threshold signal strength. In some embodiments, control unit 256 may also be configured to perform digital calibration to reduce the amount of non-linearity present in the signal when the selected signal is the filtered second digital signal output by the second ADC path 230.

Figure 4:
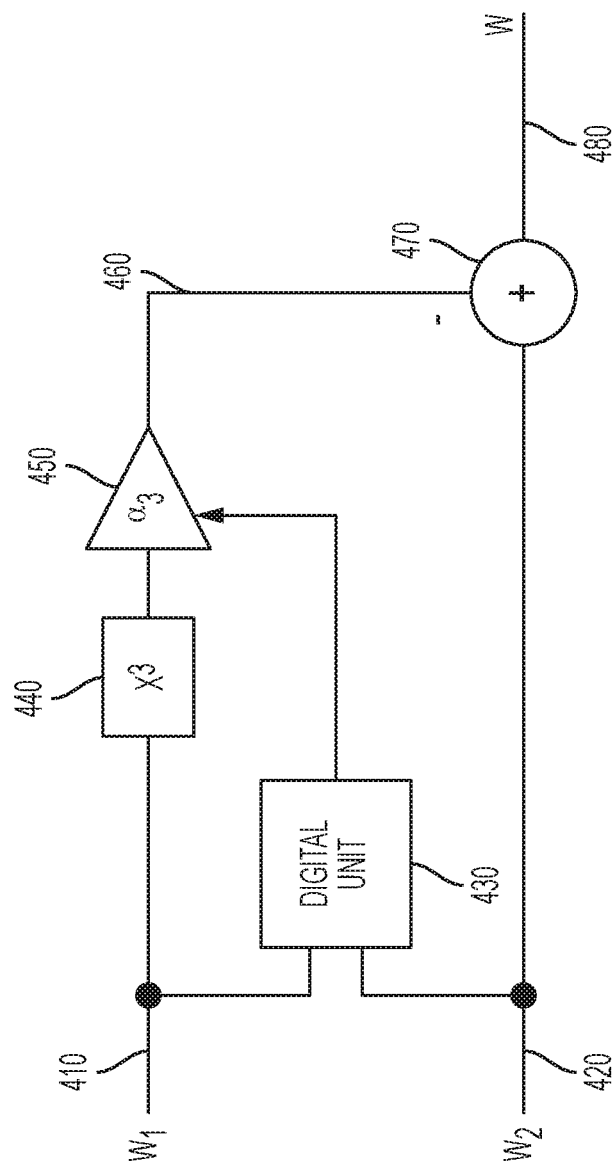
FIG. 4 is an example schematic block diagram illustrating non-linear cancellation for a dual-path ADC system according to one embodiment of the disclosure.

FIG. 4 provides an example schematic block diagram illustrating non-linear cancellation for a dual-path ADC system according to one embodiment of the disclosure. The non-linear cancellation illustrated in FIG. 4 may be the non-linear cancellation performed in control unit 256 of digital signal processing block 250. As illustrated in FIG. 4, control unit 256 may include a digital unit 430 configured to receive a first digital signal 410 and a second digital signal 420. As illustrated in FIG. 2, the first digital signal 410 may be the filtered version of the first digital signal output by the first ADC path 210 and the second digital signal 420 may be the filtered and attenuated version of the second digital signal output by the second ADC path 230. In other embodiments, first digital signal 410 and second digital signal 420 may be the unfiltered and/or unattenuated versions of the digital signals output by the first ADC path 210 and the second ADC path 230.

Digital unit 430 may be configured to determine one or more non-linear coefficients of the second digital signal based, at least in part, on processing of the first and second digital signal. For example, as illustrated in the embodiment of FIG. 2, the first digital signal may be a linear signal 272 and the second digital signal may be a third-order non-linear signal 270. Thus, the first digital signal and the second digital signal may be respectively represented as:

$$V_{o1} = A\sin(\omega t)$$

$$V_{o2} = A\sin(\omega t) + \alpha_3 (A\sin(\omega t))^3.$$

Using cross-correlation, the third-order non-linearity coefficient may be determined as:

$$CC = V_{01} \otimes V_{02} = \frac{A^2}{2}\left(1 + \frac{3\alpha_3}{4}A^2\right) \rightarrow \alpha_3 = \frac{4}{3A^2}\left(\frac{2 \cdot CC}{A^3} - 1\right).$$

Figure 5:
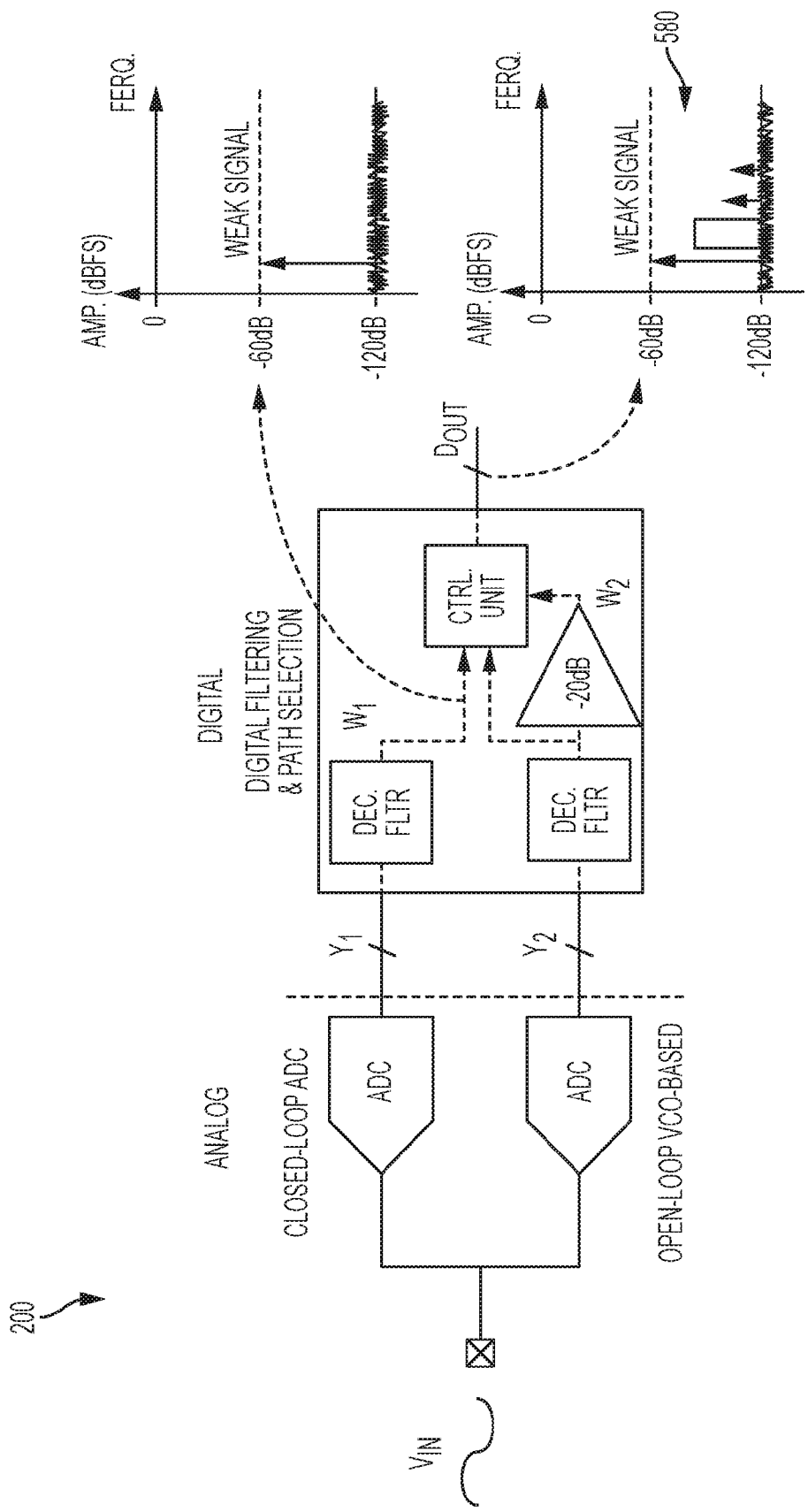
FIG. 5 is an example schematic block diagram illustrating non-linear cancellation performed in a VCO-based dual-path ADC system with non-linear cancellation according to one embodiment of the disclosure.

With the one or more non-linear coefficients of the second digital signal determined, the digital unit 430 may be configured to modify the second digital signal based, at least in part, on the determined one or more non-linear coefficients to generate a more linear second digital signal. For example, digital unit 430 may be configured to generate one or more non-linear components of the second digital signal based, at least in part, on the determined one or more non-linear coefficients and subtract the generated one or more non-linear components from the second digital signal. In particular, FIG. 4 illustrates that after the third-order non-linearity coefficient 450 has been determined, the third-order non-linearity component can be generated by cubing the first digital signal 410 using cubing block 440 and then multiplying the cubed result by the determined third-order non-linear coefficient. The generated third-order non-linear component 460 may then be subtracted from the second digital signal 420 to produce a modified second digital signal 580, output as signal $D_{OUT}$ of FIG. 5, in which the third-order non-linearity component has been removed. In some embodiments, after the non-linear coefficients for the VCO-based ADC 240 have been determined during the calibration phase disclosed above with reference to FIG. 4, the non-linear coefficients may be used during normal operation of the VCO-based dual-path ADC system 200 to remove non-linearity of signals propagating through second ADC path 230.

Although the operations for removing third-order non-linearity components have been described in detail herein, one of skill in the art would readily recognize that the same operations may be used to perform cancellation of higher-order non-linear components. For example, the same operations may be used to cancel fifth-order non-linear components of digital signals output by second ADC path 230 that includes VCO-based ADC 240.

Figure 6:
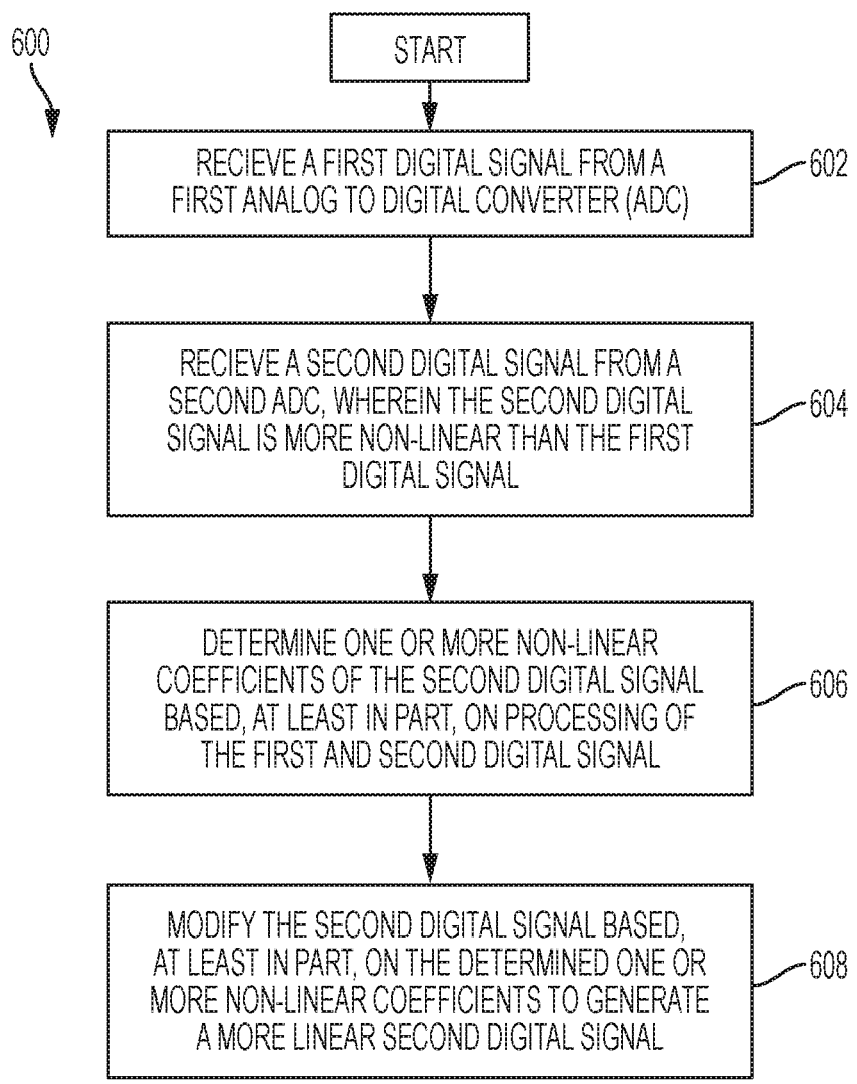
FIG. 6 is an example flow chart illustrating a method for non-linearity cancellation of an open-loop VCO-based ADC in a dual-path ADC according to one embodiment of the disclosure.

FIG. 6 is an example flow chart illustrating a method for non-linearity cancellation of an open-loop VCO-based ADC in a dual-path ADC according to one embodiment of the disclosure. Method 600 may be implemented with the systems described with respect to FIGS. 2-5 or other systems. Method 600 begins, at block 602, with receiving a first digital signal from a first analog to digital converter (ADC). At block 604, the method 600 includes receiving a second digital signal from a second ADC, wherein the second digital signal is more non-linear than the first digital signal. At block 606, method 600 includes determining one or more non-linear coefficients of the second digital signal based, at least in part, on processing of the first and second digital signal.

At block 608, method 600 includes modifying the second digital signal based, at least in part, on the determined one or more non-linear coefficients to generate a more linear second digital signal. In some embodiments, the modifying step of block 608 may include generating one or more non-linear components of the second digital signal based, at least in part, on the determined one or more non-linear coefficients and subtracting the generated one or more non-linear components from the second digital signal.

In some embodiments, the systems described with respect to FIGS. 2-5 may also perform the steps of filtering the first and second digital signal and selecting one of the filtered first digital signal and the filtered second digital signal for further processing. According to an embodiment, selecting may include selecting the filtered first digital signal when a signal strength associated with an input signal used to generate the first digital signal is equal to or exceeds a threshold signal strength and selecting the filtered second digital signal when the signal strength associated with the input signal used to generate the second digital signal is less than the threshold signal strength.

The schematic flow chart diagram of FIG. 6 is generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although analog-to-digital converters (ADCs) are described in embodiments above, aspects of the disclosed invention may also be applied to digital-to-analog converters (DACs) or digital-to-digital converters. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
    a first analog to digital converter (ADC) configured to receive an input signal from an input terminal and generate a first digital signal;
    a second ADC configured to receive the input signal from the input terminal and generate a second digital signal, wherein the second digital signal is more non-linear than the first digital signal; and
    a digital signal processing block configured to:
        receive the first digital signal and the second digital signal;
        determine one or more non-linear coefficients of the second digital signal based, at least in part, on processing of the first and second digital signals; and
        modify the second digital signal based, at least in part, on the determined one or more non-linear coefficients to generate a more linear second digital signal.

2. The apparatus of claim 1, wherein the digital signal processing block is configured to:
    generate one or more non-linear components of the second digital signal based, at least in part, on the determined one or more non-linear coefficients; and
    subtract the generated one or more non-linear components from the second digital signal.

3. The apparatus of claim 1, wherein the first ADC comprises a closed-loop ADC.

4. The apparatus of claim 1, wherein the second ADC comprises an open-loop voltage controlled oscillator-based (VCO-based) ADC.

5. The apparatus of claim 1, wherein the second ADC is configured to amplify the received input signal.

6. The apparatus of claim 1, wherein the digital signal processing block is further configured to:
    filter the first and second digital signals; and
    select one of the filtered first digital signal and the filtered second digital signal for further processing.

7. The apparatus of claim 6, wherein the digital signal processing block being configured to:
    select the filtered first digital signal when a signal strength associated with the input signal is equal to or exceeds a threshold signal strength; and
    select the filtered second digital signal when the signal strength associated with input signal is less than the threshold signal strength.

8. The apparatus of claim 1, wherein the first ADC is further configured to receive input signals having an amplitude higher than input signals for which the second ADC is configured to receive.

9. A method, comprising:
    receiving a first digital signal from a first analog to digital converter (ADC);
    receiving a second digital signal from a second ADC, wherein the second digital signal is more non-linear than the first digital signal;
    determining one or more non-linear coefficients of the second digital signal based, at least in part, on processing of the first and second digital signals; and
    modifying the second digital signal based, at least in part, on the determined one or more non-linear coefficients to generate a more linear second digital signal.

10. The method of claim 9, wherein the step of modifying comprises:
    generating one or more non-linear components of the second digital signal based, at least in part, on the determined one or more non-linear coefficients; and
    subtracting the generated one or more non-linear components from the second digital signal.

11. The method of claim 9, further comprising:
    filtering the first and second digital signals; and
    selecting one of the filtered first digital signal and the filtered second digital signal for further processing.

12. The method of claim 11, wherein the step of selecting comprises:
    selecting the filtered first digital signal when a signal strength associated with an input signal used to generate the first digital signal is equal to or exceeds a threshold signal strength; and
    selecting the filtered second digital signal when the signal strength associated with the input signal used to generate the second digital signal is less than the threshold signal strength.

13. An apparatus, comprising:
    a controller configured to perform steps comprising:
        receive a first digital signal from a first analog to digital converter (ADC);
        receive a second digital signal from a second ADC, wherein the second digital signal is more non-linear than the first digital signal;
        determine one or more non-linear coefficients of the second digital signal based, at least in part, on processing of the first and second digital signals; and modify the second digital signal based, at least in part, on the determined one or more non-linear coefficients to generate a more linear second digital signal.

14. The apparatus of claim 13, wherein modifying, by the controller, comprises the controller being further configured to perform the steps comprising:
generating one or more non-linear components of the second digital signal based, at least in part, on the determined one or more non-linear coefficients; and
subtracting the generated one or more non-linear components from the second digital signal.

15. The apparatus of claim 13, wherein the first ADC comprises a closed-loop ADC.

16. The apparatus of claim 13, wherein the second ADC comprises an open-loop voltage controlled oscillator-based (VCO-based) ADC.

17. The apparatus of claim 13, wherein the controller is further configured to perform steps comprising:
filtering the first and second digital signals; and
selecting one of the filtered first digital signal and the filtered second digital signal for further processing.

18. The apparatus of claim 17, wherein selecting, by the controller, comprises the controller being further configured to perform steps comprising:
selecting the filtered first digital signal when a signal strength associated with an input signal used to generate the first digital signal is equal to or exceeds a threshold signal strength; and
selecting the filtered second digital signal when the signal strength associated with the input signal used to generate the second digital signal is less than the threshold signal strength.

19. The apparatus of claim 13, wherein the controller comprises an audio coder/decoder (CODEC).

* * * * *